United States Patent
Lim et al.

[11] Patent Number: 5,953,584
[45] Date of Patent: Sep. 14, 1999

[54] METHOD OF FABRICATING LIQUID CRYSTAL DISPLAY DEVICE HAVING ALIGNMENT DIRECTION DETERMINED

[75] Inventors: Kyoung Nam Lim, Seoul; Jeong Hyun Kim, Kyungki-do, both of Rep. of Korea

[73] Assignee: LG Electronics Inc., Seoul, Rep. of Korea

[21] Appl. No.: 08/942,197

[22] Filed: Oct. 1, 1997

[30] Foreign Application Priority Data

Oct. 2, 1996 [KR] Rep. of Korea ............... 96-43723

[51] Int. Cl.[6] .................................................. H01L 21/00
[52] U.S. Cl. ......................... 438/30; 438/34; 438/150; 438/586; 438/587; 438/608; 438/157; 257/59; 257/72
[58] Field of Search .................... 438/30, 150, 151, 438/34, 608, 157, 587, 586, FOR 155, FOR 184, FOR 201, FOR 287; 257/59, 66, 72, 347

[56] References Cited

U.S. PATENT DOCUMENTS

| | | | |
|---|---|---|---|
| 5,345,324 | 9/1994 | Koseki et al. | 359/67 |
| 5,464,669 | 11/1995 | Kang et al. | 428/1 |
| 5,528,401 | 6/1996 | Narutaki et al. | 359/76 |
| 5,538,823 | 7/1996 | Park et al. | 430/20 |
| 5,763,899 | 6/1998 | Yamazaki et al. | 257/59 |

FOREIGN PATENT DOCUMENTS

| | | |
|---|---|---|
| 0 525 477 A1 | 2/1993 | European Pat. Off. . |
| 0 525 478 A2 | 2/1993 | European Pat. Off. . |
| 0 632 311 A1 | 1/1995 | European Pat. Off. . |
| 0 684 500 A2 | 11/1995 | European Pat. Off. . |
| WO 95/22075 | 8/1995 | WIPO . |

OTHER PUBLICATIONS

M. Schadt et al., "Surface–Induced Parallel Alignment of Liquid Crystals By Linearly Polymerized Photopolymers," Japanese Journal of Applied Physics, Part 1, vol. 31, No. 7, pp. 2155–2164, Jul. 1992.

*Primary Examiner*—Peter Toby Brown
*Assistant Examiner*—Long Pham
*Attorney, Agent, or Firm*—Morgan, Lewis & Bockius LLP

[57] ABSTRACT

A method of fabricating a liquid crystal display device having a substrate includes the steps of forming a gate electrode on the substrate, forming a gate insulating layer on the gate electrode, forming a semiconductor layer on the gate insulating layer, forming source/drain electrodes on the semiconductor layer, forming a pixel electrode on the source/drain electrodes including the gate insulating layer, forming a passivation layer on the pixel electrode including the source/drain electrodes, forming a light shielding layer on the passivation layer, forming an alignment layer on the light shielding layer including the passivation layer, and determining an alignment direction by exposing the alignment layer to a light.

25 Claims, 4 Drawing Sheets

UV exposure

METHOD OF FABRICATING LIQUID CRYSTAL DISPLAY DEVICE HAVING ALIGNMENT DIRECTION DETERMINED

This application claims the benefit of Korean Application No. 1996-43723 filed on Oct. 2, 1996, which is hereby incorporated by reference.

BACKGROUND OF THE INVENTION

1. Field of the Invention

The present invention relates to a liquid crystal display device, and more particularly to a method of fabricating the liquid crystal display device. Although the present invention is suitable for a wide scope of applications, it is particularly suitable for improving the quality of picture image.

2. Discussion of the Related Art

A CRT(cathode ray tube) display device has been widely used for televisions or personal computers. With the advent of modern information era, display devices have been required for larger screen size and smaller total volume of the device. However, the CRT is not an appropriate device to follow the trend because it requires a minimum distance between a screen and an electron gun. Thus, the CRT cannot be applied to small size and lower power consumption electronics such as wall-mounted televisions, portable televisions, and notebook computers.

For small size and low power consumption display devices, flat panel display devices such as LCD(Liquid Crystal Display), PDP(Plasma Display Panel), ELD (Electroluminescent Display), and VFD(Vacuum Fluorescent Display) have been introduced throughout the industries. Among the flat panel display devices, the LCD has been most widely researched device because it provides good picture quality and low power consumption in spite of various disadvantages.

There are two types of LCD; a passive matrix driving LCD and an active matrix driving LCD(hereinafter "AMLCD"). The AMLCD has been in more demand recently because a switching element is capable of independently operating each pixel for a high contrast ratio and a high resolution by minimizing a interference from neighboring pixels.

FIG. 1 is a plan view of a conventional AMLCD. As shown in FIG. 1, a gate bus line 1 and a data bus line 2 are crossing each other to define the pixel region. A thin film transistor (TFT) having a gate electrode 3 and source/drain electrodes 4 are disposed near the respective crossings of the gate bus line 1 and the data bus line 2. When the voltage is applied to the data bus line 2 through a data driving circuit of the liquid crystal panel, the TFT is operated and the signal is applied to the pixel electrode in the pixel region from the gate driving circuit.

An image representation region is the pixel region having a pixel electrode 5. Thus, a light shielding layer 6 must be formed to prevent the leakage of light through the gate bus line 1, the data bus line 2, and the TFT. The light shielding layer 6 is generally formed on a color filter substrate. In this case, however, there is a significant problem as set forth below. If the light shielding layer 6 on the color filter substrate does not correctly cover the gate bus line 1, the data bus line 2, and the TFT, the light leaks through these regions, so that the image quality is deteriorated. Moreover, if the light shielding layer 6 is extended so that the shielding layer 6 overlaps the pixel electrode 5 for preventing the light leakage, an aperture ratio becomes small.

In order to solve the problem, the light shielding layer 6 is directly formed on the gate bus line 1, the data bus line 2, and the TFT in the conventional LCD device as shown in FIG. 2. The gate electrode 3 and the gate insulating layer 11 are formed on the substrate 10. A semiconductor layer 13 is deposited on the gate insulating layer 11 and the source/drain electrodes 4 are formed thereon. Subsequently, a pixel electrode 5 contacting one of the source/drain electrodes 4 is formed on the pixel region. A passivation layer 16 is deposited over the pixel electrode 5 and the source/drain electrode 4.

Thereafter, the light shielding layer 6 is formed on the passivation layer 16 in the gate bus line 1, the data bus line 2, and the TFT region. An alignment layer 18 is then formed on the entire surface over the substrate 10. The light shielding layer 6 in this process is made of black resin, while the light shielding layer formed on the color filter substrate is made of metals such as Cr and CrOx. Since the light shielding layer 6 is directly formed on the gate bus line 1, the gate bus line 2, and TFT, the leakage of the light through these regions is prevented. Although a portion of the light shielding layer 6 of FIG. 2 is overlapped with the pixel electrode 5, the overlapped portion is very small, so that the aperture ratio is not much decreased.

Nonetheless, there is still a problem in the LCD of FIG. 2 as set forth below. When the substrate 10 is rubbed with a rubbing cloth to align the liquid crystal molecules, a portion of the pixel region is not rubbed completely due to a step H of the light shielding layer 6. As a result, the liquid crystal molecules in the portion L are not aligned properly. Although the liquid crystal molecules should be aligned in a predetermined direction along the rubbing direction, the liquid crystal molecules in the portion L are randomly aligned irrespective of the rubbing direction. Thus, the declination of the light occurs at the boundary between the aligned region and the non-aligned region due to the leakage of the light. The declination of the light is one of the main factors deteriorating the image quality of the LCD.

In order to solve this problem, a LCD structure shown in FIG. 3 is disclosed in U.S. Pat. No. 5,345,324. The structure of the LCD is similar to the conventional LCD shown in FIG. 2 except for an opaque metal layer 44 on a pixel electrode 35 below a non-aligned region L. A passivation layer 46 is deposited on the opaque metal layer 44 and a light shielding layer 36 is formed thereon. Thus, the opaque metal layer 44 shields the leakage of light through the region L and prevents the declination of the light on the screen caused by a step H of the light shielding layer 36. In this structure, however, the light shielding layer 36 decreases an image representation region so that the aperture ratio is also decreased.

SUMMARY OF THE INVENTION

Accordingly, the present invention is directed a method of fabricating a liquid crystal display device that substantially obviates one or more of the problems due to limitations and disadvantages of the related art.

An object of this invention is to provide a method of fabricating a liquid crystal display device having an improved image quality using a photo-alignment process.

Another object of the present invention is to provide the method of fabricating the liquid crystal display device having a high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating the liquid crystal display device having a substrate includes the steps of forming a plurality of gate bus lines and data bus lines crossing each other over the substrate, forming a plurality of thin film transistors near respective crossings of the gate bus lines and data bus lines, forming a pixel electrode over each thin film transistor, forming a passivation layer on the pixel electrode including the thin film transistors, forming a light shielding layer on the passivation layer, forming an alignment layer on the light shielding layer including the passivation layer, and exposing the alignment layer to a light to determine an alignment direction.

In another aspect of the present invention, the method of fabricating a liquid crystal display device having a substrate includes the steps of forming a gate electrode on the substrate, forming a gate insulating layer on the gate electrode, forming a semiconductor layer on the gate insulating layer, forming source/drain electrodes on the semiconductor layer, forming a pixel electrode on the source/drain electrodes including the gate insulating layer, forming a passivation layer on the pixel electrode including the source/drain electrodes, forming a light shielding layer on the passivation layer, forming an alignment layer on the light shielding layer including the passivation layer, and determining an alignment direction by exposing the alignment layer to a light.

In a further aspect of the present invention, the method of fabricating a liquid crystal display device having first and second substrates includes the steps of forming a gate electrode on the first substrate, forming a gate insulating layer on the gate electrode, forming a semiconductor layer on the gate insulating layer, forming source/drain electrodes on the semiconductor layer, forming a pixel electrode on the source/drain electrodes including the gate insulating layer, forming a passivation layer on the pixel electrode including the source/drain electrodes, forming a light shielding layer on the passivation layer, forming a first alignment layer on the light shielding layer including the passivation layer, and exposing the first alignment layer to a first light, forming a second alignment over the second substrate, exposing the second alignment layer to a second light, assembling the first and second substrates, injecting liquid crystal molecules into a space between the first and second substrates to determine an alignment direction.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
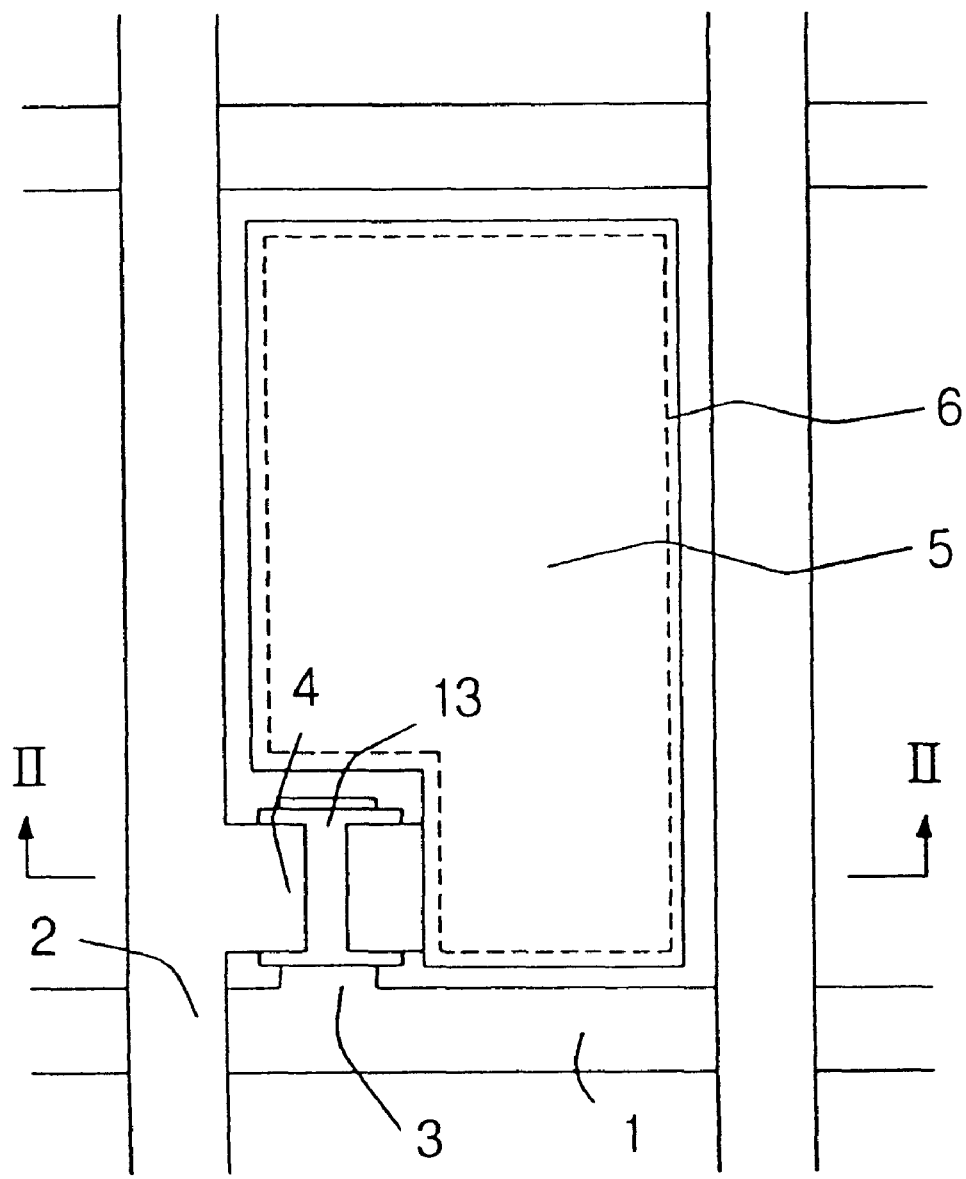
FIG. 1 is a plan view of a conventional liquid crystal display device.
Figure 2:
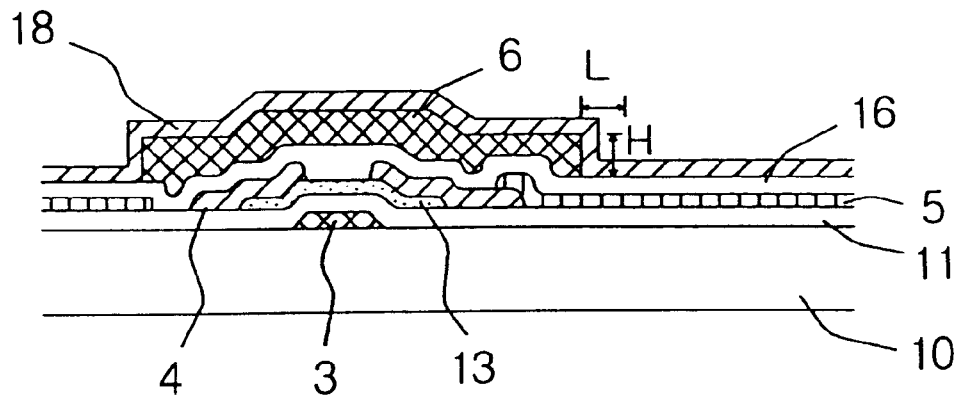
FIG. 2 is a cross-sectional view taken along the line II-II' of FIG. 1.
Figure 3:
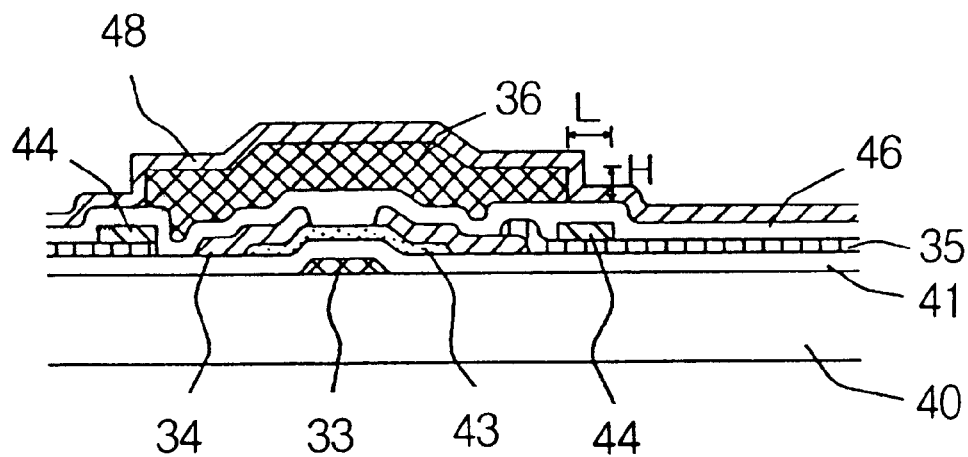
FIG. 3 is a cross-sectional view of another conventional liquid crystal display device.
Figure 4A:
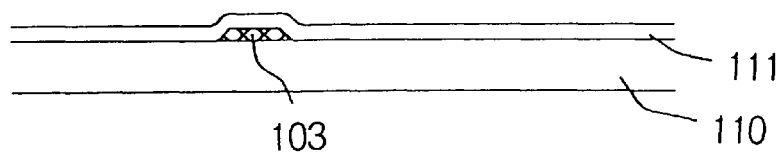
FIGS. 4A to 4E are cross-sectional views showing the process steps of fabricating the liquid crystal display device according to a first embodiment of the present invention.

Referring to FIGS. 4A to 4E, a method of fabricating a liquid crystal display device according to a first embodiment of the present invention will now be described. A gate electrode 103 and the gate bus line (not shown) are successively formed on a substrate 110 by etching a sputtered metal layer such as Cr, Mo, Al, and Ti, as shown in FIG. 4A. In this process, the gate electrode 103 may be anodized to increase the insulating characteristic of the gate electrode 103. Subsequently, a gate insulating layer 111 such as SiNx and SiOx is deposited by a chemical vapor deposition (CVD) process.

Figure 4B:
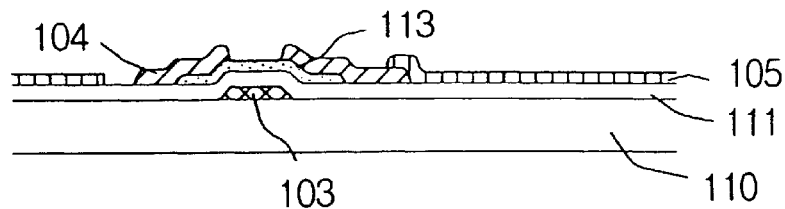

Thereafter, an amorphous silicon(a-Si) layer is deposited on the gate insulating layer 111 by the CVD and etching processes to form a semiconductor layer 113, as shown in FIG. 4B. On the semiconductor layer 113, a sputtered metal layer, for example, Cr, Ti, and Al, is etched to form source/drain electrodes 104 and a data bus line (not shown). An n'-amorphous silicon layer may be formed on the semiconductor layer 113 as an ohmic contact layer.

The semiconductor layer 113 and the source/drain electrodes 104 are respectively formed by the deposition and etching processes. After the a-Si and the metal layers are successively deposited, the metal layer is etched to form the source/drain electrodes 104. The a-Si layer is then etched using the source/drain electrodes 104 as masks to form the semiconductor layer 113.

Thereafter, a transparent metal such as indium tin oxide on the pixel region is deposited and etched to form a pixel electrode 105. In this process, the pixel electrode 105 is connected to one of the source/drain electrodes 104.

Figure 4C:
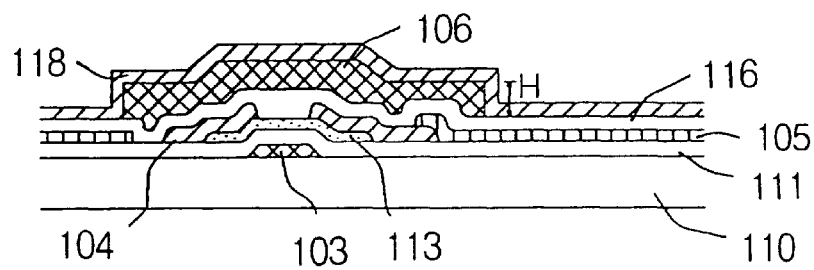

Subsequently, a passivation layer 116 is formed over the substrate 110 by depositing inorganic materials such as SiNx and SiOx. Black resin is then deposited thereon to form a light shielding layer 106, as shown in FIG. 4C. A portion of the light shielding layer 106 is overlapped with the pixel electrode 105 to prevent the light leakage through the gate bus line, the data bus line, and the TFT. The light shielding layer 106 has a step H after this process.

Thereafter, a photo-alignment layer 118, for example, polysiloxane based materials and polyvinylfluorocinnamate (PVCN-F), is formed on the entire surface over the substrate and exposed to the light such as ultraviolet to determine an alignment direction of the liquid crystal molecules. The polysiloxane based material has a pre-tilted angle depending upon UV absorption energy.

Figure 4D:
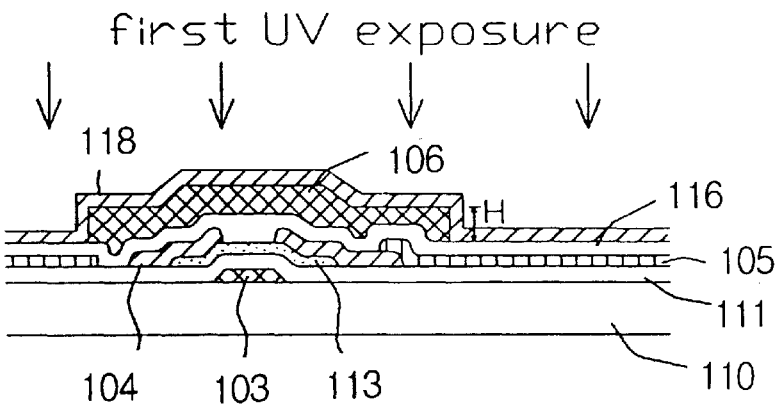
Figure 4E:
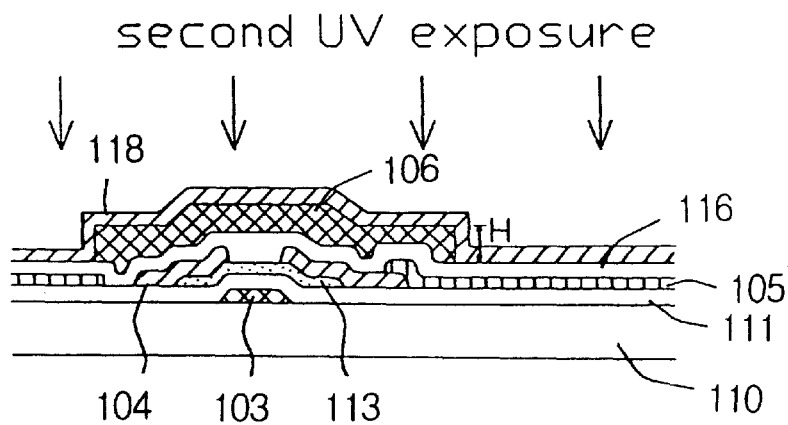

As shown in FIGS. 4D and 4E, the alignment layer 118 is exposed to the polarized and unpolarized light. By exposing to the polarized light, degenerated pre-tilted directions perpendicular to the polarization direction of the exposed light are generated on the surface of the alignment layer 118. When the alignment layer 118 is exposed to the unpolarized light, only one of the degenerated directions parallel to the irradiation direction of the exposed light is selected, so that the desired pre-tilted direction is obtained.

FIGS. 5A to 5E are cross-sectional views showing the process steps of fabricating the liquid crystal display device in accordance with a second embodiment of the present invention. In this embodiment, the alignment direction is determined by exposing the light and a subsequent injection of the liquid crystal molecules between liquid crystal panels.

A gate electrode 203, a gate bus line (not shown), and a TFT are successively formed on a first substrate 210a. A pixel electrode 205 is formed on a pixel region. A passivation layer 216 is then deposited over the entire surface of the first substrate 210a and a light shielding layer 206 is formed thereon. A photo-alignment material such as PVCN-F and polysiloxane based materials is coated over the entire surface of the first substrate 210a to form a first alignment layer 218a.

Figure 5A:
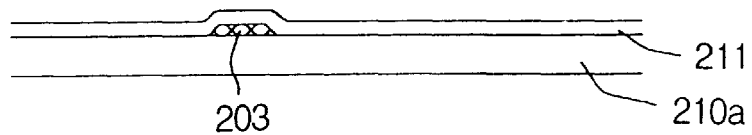
FIGS. 5A to 5E are views showing the process steps of fabricating the liquid crystal display device according to a second embodiment of the present invention.
Figure 5B:
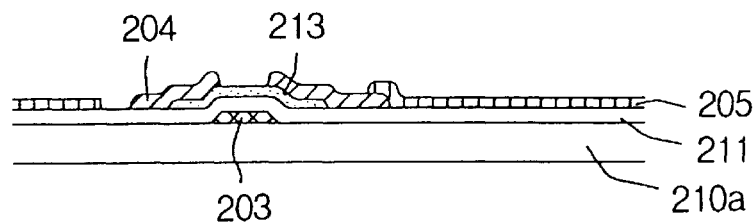
Figure 5C:
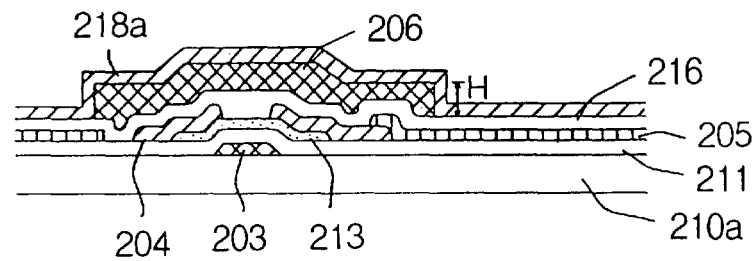
Figure 5D:
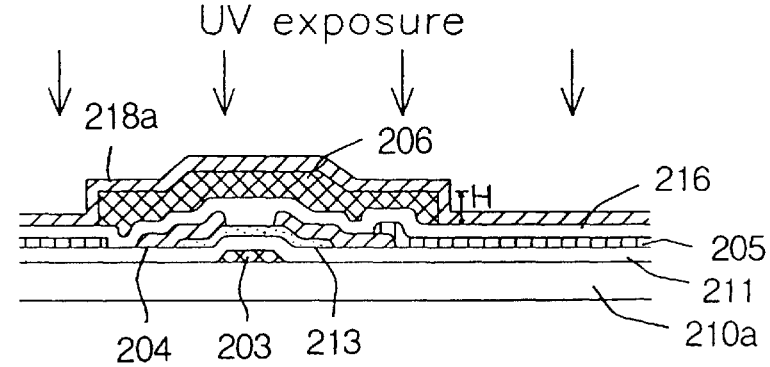
Figure 5E:
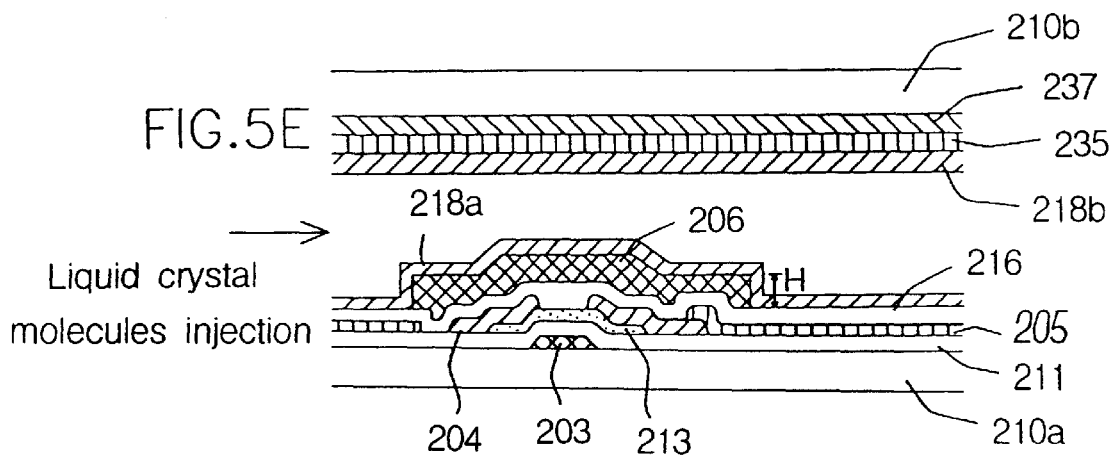

Thereafter, the first substrate 210a is exposed to polarized light such as ultraviolet to determine a degenerated pre-tilted direction perpendicular to the polarization direction of the exposed light on the first alignment layer 218a, as shown in FIG. 5D. Subsequently, a color filter layer 237, a counter electrode 235 made of indium tin oxide, and a second alignment layer 218b are formed over the second substrate 210b, as shown in FIG. 5E. By exposing the second substrate 210b to the light having a different polarization direction from that of the first exposure process, a different degenerated pre-tilt direction is determined in the second alignment layer 218B.

After assembling the first and second substrates 210a and 210b, one of the degenerated pre-tilted directions in the first and second alignment layers 218a, 218b is finally determined by a flowing effect of the liquid crystal molecules injected between the first and second substrates 210a and 210b. After the first and second substrates 210a and 210b are exposed to the light, the liquid crystal molecules including chiral dopants are then injected between the first and second substrates 210a and 210b.

Accordingly, as described above, since the light shielding layer (for example, black resin) is exposed to light to form the alignment direction without a rubbing process, the declination of the light caused by the step in the light shielding layer is prevented. Thus, the image quality is improved. Further, the aperture ratio is increased because the metal layer below the step in the light shielding layer for preventing the declination is not needed in the present invention.

It will be apparent to those skilled in the art that various modifications and variations can be made in the method of fabricating liquid crystal display of the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device having a substrate, comprising the steps of:
    forming a gate electrode on the substrate;
    forming a gate insulating layer on the gate electrode;
    forming a semiconductor layer on the gate insulating layer;
    forming source/drain electrodes on the semiconductor layer;
    forming a pixel electrode on the source/drain electrodes including the gate insulating layer;
    forming a passivation layer on the pixel electrode including the source/drain electrodes;
    forming a light shielding layer on the passivation layer;
    forming an alignment layer on the light shielding layer including the passivation layer;
    exposing the alignment layer to a polarized light to define degenerated pre-tilted directions perpendicular to a polarization direction of the polarized light; and
    exposing the alignment layer to an unpolarized light to select one of the degenerated pre-tilted directions parallel to the unpolarized light.

2. The method according to claim 1, further comprising the step of forming an ohmic contact layer on the semiconductor layer prior to the step of forming source/drain electrodes on the semiconductor layer.

3. The method according to claim 1, further comprising the step of anodizing the gate electrode after the step of forming a gate electrode.

4. The method according to claim 1, wherein the pixel electrode includes indium tin oxide.

5. The method according to claim 1, wherein the light shielding layer includes black resin.

6. The method according to claim 1, wherein the alignment layer is selected from the group consisting of materials based on polyvinylcinnamate and polysiloxane.

7. The method according to claim 1, wherein the alignment layer has a pre-tilted angle depending upon an absorption energy of the light.

8. The method according to claim 1, wherein the polarized light and the unpolarized light include ultraviolet light.

9. A method of fabricating a liquid crystal display device having first and second substrates, comprising the steps of:
    forming a gate electrode on the first substrate;
    forming a gate insulating layer on the gate electrode;
    forming a semiconductor layer on the gate insulating layer;
    forming source/drain electrodes on the semiconductor layer;
    forming a pixel electrode on the source/drain electrodes including the gate insulating layer;
    forming a passivation layer on the pixel electrode including the source/drain electrodes;
    forming a light shielding layer on the passivation layer;
    forming a first alignment layer on the light shielding layer including the passivation layer; and
    exposing the first alignment layer to a first light;
    forming a second alignment over the second substrate;
    exposing the second alignment layer to a second light;
    coupling the first and second substrates to define a space for liquid crystal molecules;
    injecting the liquid crystal molecules into the space between the first and second substrates to align the liquid crystal molecules along an alignment direction defined by the first and second alignment layers.

10. The method according to claim 9, further comprising the step of forming an ohmic contact layer on the semiconductor layer prior to the step of forming source/drain electrodes on the semiconductor layer.

11. The method according to claim 9, further comprising the step of anodizing the gate electrode after the step of forming a gate electrode.

12. The method according to claim 9, wherein the pixel electrode includes indium tin oxide.

13. The method according to claim 9, wherein the light shielding layer includes black resin.

14. The method according to claim 9, wherein the alignment layer is selected from the group consisting of materials based on polyvinylcinnamate and polysiloxane.

15. The method according to claim 9, wherein the first alignment layer has a pre-tilted angle depending upon an absorption energy of the light.

16. The method according to claim 9, wherein first and second light include ultraviolet.

17. The method according to claim 9, wherein the first light includes polarized light having a polarization direction different from the second light.

18. A method of fabricating a liquid crystal display device having a substrate, comprising the steps of:

forming a plurality of gate bus lines and data bus lines crossing each other over the substrate;

forming a plurality of thin film transistors near respective crossings of the gate bus lines and data bus lines;

forming a pixel electrode over each thin film transistor;

forming a passivation layer on the pixel electrode including the thin film transistors;

forming a light shielding layer on the passivation layer;

forming an alignment layer on the light shielding layer including the passivation layer;

exposing the alignment layer to a polarized light to define degenerated pre-tilted directions perpendicular to a polarization direction of the polarized light; and exposing the alignment layer to an unpolarized light to select one of the degenerated pre-tilted directions parallel to the unpolarized light.

19. The method according to claim 18, wherein the step of forming a plurality of thin film transistors comprises the steps of:

forming a gate electrode on the substrate;

depositing a gate insulating layer on the gate electrode and the substrate;

forming a semiconductor layer on the gate insulating layer; and forming source/drain electrodes on the semiconductor layer.

20. The method according to claim 19, further comprising the step of:

forming an ohmic contact layer on the semiconductor layer after the step of forming a semiconductor layer.

21. The method according to claim 19, further comprising the step of:

anodizing the gate electrode after the step of forming a gate electrode.

22. The method according to claim 18, wherein the light shielding layer includes black resin.

23. The method according to claim 18, wherein the alignment layer is selected from the group consisting of materials based on polyvinylcinnamate and polysiloxane.

24. The method according to claim 18, wherein the alignment layer has a pre-tilted angle depending upon an absorption energy of the light.

25. The method according to claim 18, wherein the polarized light and the unpolarized light include ultraviolet light.

* * * * *